United States Patent [19]
Zettler

[11] Patent Number: 6,122,199
[45] Date of Patent: Sep. 19, 2000

[54] SEMICONDUCTOR STORAGE DEVICE

[75] Inventor: Thomas Zettler, München, Germany

[73] Assignee: Siemens Aktiengesellschaft, Munich, Germany

[21] Appl. No.: 09/155,392

[22] PCT Filed: Mar. 20, 1997

[86] PCT No.: PCT/DE97/00576

§ 371 Date: Sep. 28, 1998

§ 102(e) Date: Sep. 28, 1998

[87] PCT Pub. No.: WO97/37354

PCT Pub. Date: Oct. 9, 1997

[30] Foreign Application Priority Data

Mar. 28, 1996 [DE] Germany .......................... 196 12 456

[51] Int. Cl.[7] .................................................. G11C 16/06
[52] U.S. Cl. ................................ 365/185.23; 365/189.09
[58] Field of Search .......................... 365/185.23, 185.11, 365/185.29, 233, 218, 189.09, 189.11

[56] References Cited

U.S. PATENT DOCUMENTS

| | | | |
|---|---|---|---|
| 4,742,492 | 5/1988 | Smayling et al. | 365/218 |
| 4,823,318 | 4/1989 | D'Arrigo et al. | 365/189 |
| 5,371,705 | 12/1994 | Nakayama et al. | 365/189.09 |
| 5,392,253 | 2/1995 | Atsumi et al. | 365/230.06 |
| 5,455,789 | 10/1995 | Nakamura et al. | 365/185.17 |
| 5,513,147 | 4/1996 | Prickett, Jr. | 365/230.06 |
| 5,592,421 | 1/1997 | Kaneko et al. | 365/189.09 |
| 5,619,456 | 4/1997 | McClure | 365/189.05 |

FOREIGN PATENT DOCUMENTS

| | | |
|---|---|---|
| 0 182 192 | 5/1986 | European Pat. Off. . |
| 0 320 916 | 6/1989 | European Pat. Off. . |

OTHER PUBLICATIONS

A 0.5 μm CMOS Technology for Multifunctional Applications with Embedded FN–Flash Memory and Linear R and C Modules, Heinrich et al. pp. 17.4.1–17.4.4 1993 (Month unavailable).

Hi–MNOS II Technology for a 64–kbit Byte–Erasable 5–V–Only EEPROM, Yatsuda et al., pp. 152–159, Feb. 1985.

A 5–V–Only 16–Mb Flash Memory with Sector Erase Mode, Jinbo et al., pp. 1547–1553 Nov., 1992.

*Primary Examiner*—David Nelms
*Assistant Examiner*—Anh Phung
*Attorney, Agent, or Firm*—Hill & Simpson

[57] ABSTRACT

A semiconductor storage device with a multiplicity of storage cells arranged on a semiconductor substrate for programmable storage of data contents. The semiconductor storage device can be operated in at least two operating states of which the first is assigned to erasing the data content from a storage cell and the second is assigned to maintaining a data content of a storage cell. The semiconductor storage device further operates with a selection circuit for selecting an associated group of storage cells for selective application of an erase voltage and a reference voltage to the selected group of storage cells. For driving the group of storage cells which is selected by the selection circuit, for the operating states of erasing and maintaining the data content of the storage cells, a drive circuit is provided. The drive circuit is assigned in common for all storage cells of a group and with a single drive line for coupling to all storage cells of the selected group, on which drive line the erase voltage and the reference voltage are selectively connected actively to the selected group of storage cells.

21 Claims, 9 Drawing Sheets

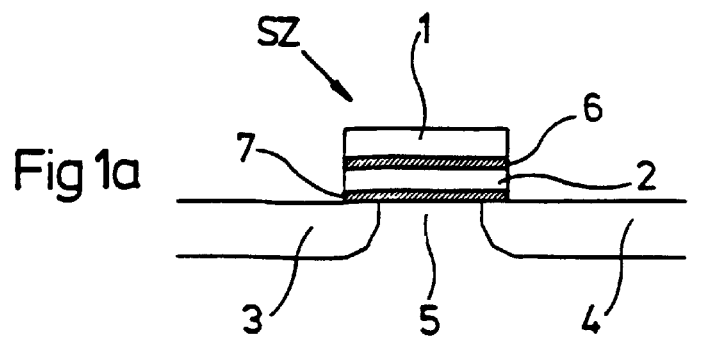
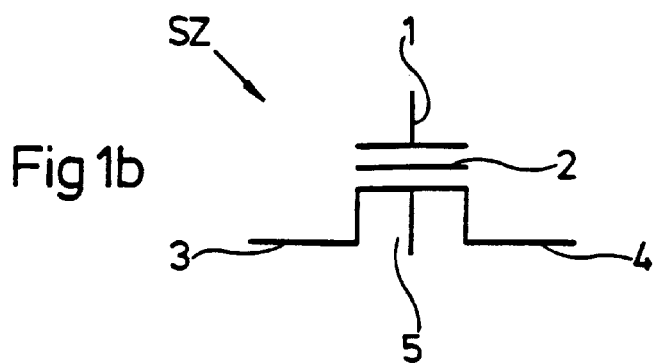
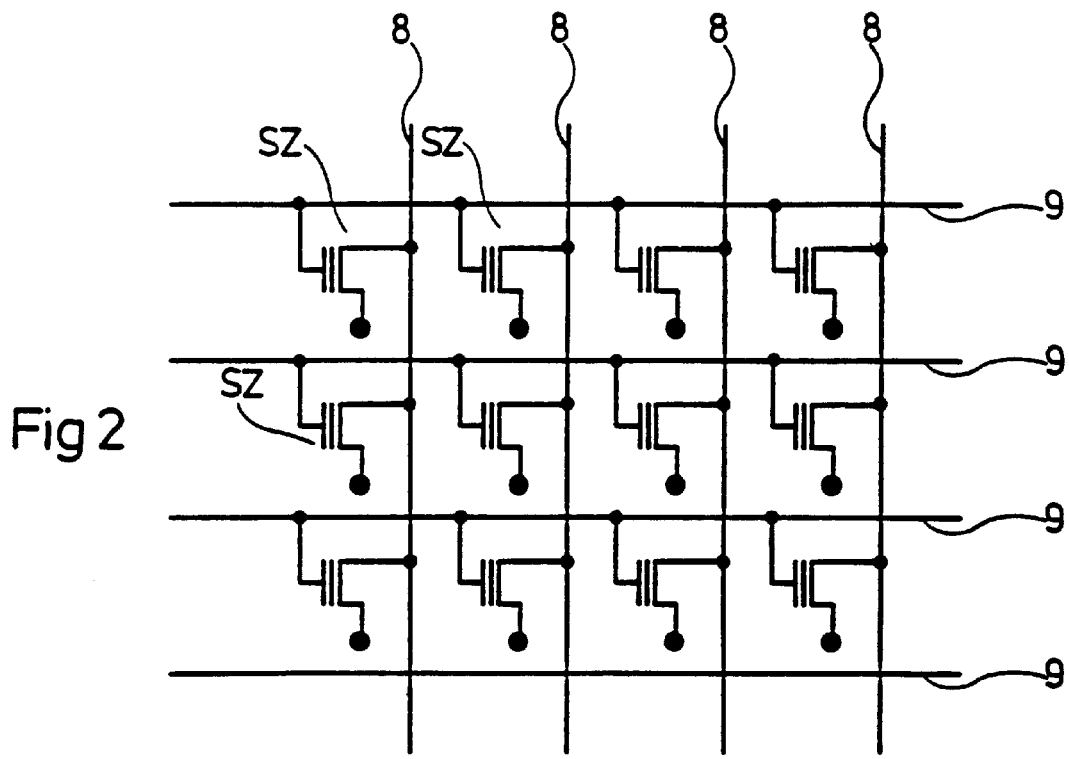

SEMICONDUCTOR STORAGE DEVICE

BACKGROUND OF THE INVENTION

1. Field of the Invention

The present invention relates to a semiconductor storage device with a multiplicity of storage cells, arranged on a semiconductor substrate, for programmable storage of data contents. The semiconductor storage device can be operated in at least two operating states; the first of which is assigned to erasing the data content from a storage cell and the second is assigned to maintaining a data content of a storage cell. The semiconductor storage device can also be operated with a selection circuit for selecting an associated group of storage cells and with at least one drive circuit with a drive line, assigned to the storage cells, for selective application of either an erase voltage or a reference voltage to the selected group of storage cells.

2. Description of the Related Art

A main field of application of a semiconductor storage device of this type is constituted by nonvolatile electrically erasable programmable semiconductor memories which are constructed from storage cells that can be programmed and re-erased as often as desired by applying predetermined voltages. Information is, in this case, stored by supplying or removing charges to or from the so-called floating gate electrode. This is done by-applying suitable voltages to word and bit lines of the storage arrangement. In the case of read operating conditions with low voltages of, typically, about 5 volts, no charges can overcome the insulation potential barrier so that the charge, once stored, remains conserved. In contrast, in the case of programming and erasing, higher voltages of, typically, about 17 volts are applied between the control gate and the source/drain/substrate.

These voltages are also referred to hereafter as high voltages, since they exceed the supply voltage in terms of magnitude. Because of a high field strength, electrons can tunnel through the insulation potential barrier (Fowler-Nordheim effect) or hot electrons originating in the vicinity of the drain can overcome the insulation (channel hot electron effect). Since the supply voltage of the storage circuit is typically about 5 volts, it is necessary to provide drive circuits for the externally supplied or internally generated programming and erase voltages, which can selectively switch these voltages onto the storage cells (or word and bit line). On the grounds of considerations relating to circuitry and technology, it is advantageous to limit the voltage range at least of one drive line (bit line or word line) to less than or equal to the value of the supply voltage and to use high voltages only on the other drive line. As a consequence, both positive and negative high voltages must be switched selectively onto the lines for programming and erasing.

Y. Yatsuda et al., IEEE J. Solid-State Circuits, Vol. sc-20. No. 1., pages 144–151, 1985 discloses a high-voltage drive circuit for positive voltages, which uses an external clock. However, the circuit, formed by NMOS transistors, cannot switch negative high voltages. Furthermore, the circuit requires a relatively large capacitance C in order to be able to deliver a sufficiently large charging current in order that the load can be charged in a time of 50 to 100 μs.

EP 320,916 EI has disclosed a drive circuit for a nonvolatile electrically erasable and programmable semiconductor memory, which can switch both positive and negative high voltages and uses an external clock. This circuit is based on the principle of assigning each load its own high-voltage generator which generates the required negative high voltage. However, the number of generator stages required increases with the magnitude of the high voltage.

For higher voltage values, this design has a large area requirement. A further disadvantage is that in erase operation (negative high voltage), the known circuit does not, in the unselected case, deliver a clean zero volt level. In a preparatory phase, a precharge is applied with a predetermined voltage value to the load. During the actual erase process, the level is limited merely by the series circuit which includes an NMOS transistor and a plurality of PMOS transistors. As a result, the known circuit is also susceptible to interference due to crosstalk. In read mode (voltage+5 volts) and write mode (voltage+15 volts), the zero volt levels are likewise not clean. Instead of this, the output voltage is equal to the magnitude of a PMOS threshold voltage. The proposal of using a transistor with a threshold voltage of zero volts shifts the problem to a more complex and, therefore, less economical technology.

IEEE Journal of Solid-State Circuits, Vol, 27, No. 11, Nov. 1, 1992, pp. 1547–1553, XP000320441, Toshikatsu Jinbo et al., "A 5-V-Only 16 MB Flash memory with Sector Erase Mode" discloses a semiconductor memory means wherein a drive circuit as row main decoder is provided with circuit blocks A and B. The circuit block A, which is referenced as a conventional block, follows an nMOS depletion transistor for the high-voltage and is active during the program mode. The circuit block B for switching the negative voltage primarily serves for converting a positive-level signal into a negative voltage level of the erase mode. To this end, the circuit block B is charged with a negative high-voltage of −13 Volts from a charge pump circuit and is switched via a drive signal. This known drive circuit thus enables the selection of an individual word line and driving with a negative erase voltage, in addition to a drive with 5 V or, respectively, 0 V for the read mode. Although the function of the known drive circuit seems to be comparable to that of the inventive circuit, the underlying structural circuit concepts differ significantly from one another.

A further drive circuit for EEPROM memory cells has been disclosed by U.S. Pat. No. 4,823,318. This drive circuit also differs from the inventive drive circuit in terms of critical, specific features.

U.S. Pat. No. 4,742,492 has disclosed a further drive circuit whose purpose lies in supplying the voltages −Vgg, −Vpp and +Vpp generated by three charge pumps to a capacitor of the output side in alternation. To this end, respectively one of the three charge pumps is connected dependent on the control signal adjacent on an input line. This drive circuit also differs from the inventive circuit in terms of individual circuit details.

The object of the present invention is to provide a circuit arrangement, of the generic type mentioned at the start, which is simpler in terms of circuitry, requires less area, has a lower power consumption overall and has the least possible cross currents, and thereby supplies clean voltage levels, particularly smooth zero volt levels, in all operating conditions.

SUMMARY OF THE INVENTION

According to the present invention, therefore, provision is made that for driving the group of storage cells, which is selected by the selection signal circuit, for the operating states of erasing and maintaining the data content of the storage cells, a drive circuit is provided which is assigned in common for all storage cells of a group and with a single drive line for coupling to all storage cells of the selected group. On this drive line, the erase voltage and the reference voltage are selectively connected actively to the selected group of storage cells.

The circuit design according to the present invention solves the problems described at the start in simple fashion and affords a range of advantages over known solutions. By providing a drive circuit which is assigned in co-on to all storage cells of a group, with a single drive line for active driving or switching of both the erase voltage (negative high voltage) and of the reference voltage (for example with an accurately defined zero volt level), it is possible for the high-voltage generation circuits to be designed as separate circuit components by being decoupled from the drive circuit. In contrast to the prior art, it is not necessary to assign each load its own high-voltage generator which generates the required erase voltage (negative high voltage). Rather, the term load Is used to denote the line to be driven by the drive circuit and the assigned circuit components (for example word line). Because of the number of generator stages required, which increases with the magnitude of the high voltage, the previously known design is inefficient in terms of area at higher voltage values. In contrast, the present invention allows global generation, assigned in common for a group of storage cells, of the required high voltages which are either externally fed to the drive circuit or are made available to the drive circuit by a high-voltage generation circuit produced on the same semiconductor substrate. The drive circuit itself can be constructed simply in terms of circuitry and may be composed of only a few components. Since, for reasons of maximizing the saving in area, the drive circuit should generally be produced in the call grid, the advantage of having the drive circuit constructed with the simplest possible circuitry is advantageous in terms of a high integration density. At the same time, the drive circuit has only a low power consumption and has essentially no cross currents which could contribute to power losses. In particular for production using n-well CMOS technology, these advantages gain great significance since all the NMOS transistors have a common substrate terminal (earth). It is therefore possible to use only PMOS transistors for switching the negative voltages.

The drive circuit according to the present invention achieves selective application, via a single drive line to the storage cells, for example as a function of a corresponding signal of both the erase voltage (negative high voltage) and the reference voltage (zero volt level) in defined form and without losses. Since storage cells form a comparatively large capacitive load, it is favorable to switch through the voltages actively, which is achieved by means of the drive circuit according to the present invention, with the most minimal time delays.

In order to discriminate whether a group of storage cells is intended to be erased or whether their data contents are to be maintained, it is provided according to the present invention that the drive circuit for selecting the erase voltage and reference voltage connected on the drive line is controlled by a selection signal produced in a selection-signal circuit connected upstream of the drive circuit. Expediently, the selection-signal circuit is connected downstream of the address decoder, usually already present in a semiconductor memory, or is designed as integrated in the semiconductor memory. This makes it possible not only to completely erase larger areas of the semiconductor memory, but also, within larger erase cycles, to maintain only the data contents of individual selected groups of storage cells, as a result of which the organizational complexity of data-processing programs can be reduced. A further advantage is provided by the fact that, since the reference voltage is smaller in terms of magnitude than the erase voltage, the drive circuit requires less time for switching the reference voltage than for switching the erase voltage. By deliberate selection of the storage cells to be erased, the required time for an erase process can be shortened.

It is also inventively provided that the drive circuit for active switching of the erase voltage and the reference voltage onto the drive line has a pump circuit, acting as a function of a selection signal, which switches the erase voltage and the reference voltage as desired, without substantially changing the value of the voltages or without generating these voltages locally.

In a development of the present invention, provision may be made that the semiconductor storage device can be operated in a third operating state which, as desired, is assigned to programming, reading and maintaining the data content of the storage cells; the semiconductor storage device having a programming-voltage generation circuit, coupled via a switching device to the drive circuit, for supplying the drive circuit with a programming voltage, which has an opposite sign to the erase voltage and exceeds the value of the supply voltage for programming a storage cell. The switching device, assigned to the drive circuit, is for selective output of the programming voltage to be applied to the drive circuit, of a read voltage to be applied to the drive circuit, or of the reference voltage to be applied to the drive circuit being controlled by means of a state selection line to the selected group of storage cells. As a result, all voltages, which are required for programming, reading, erasing and maintaining the data content of storage cells, are applied via a single line. In order to apply voltages supplied by the programing-voltage generation circuit, or voltages of the same sign which are smaller in terms of magnitude, provision may be made that a driver circuit, connected downstream of the programming-voltage generation circuit, is connected upstream of the switching device and outputs to the switching device the voltage levels assigned to the third operating state for programming, reading and maintaining the data content of the storage cells. This makes it possible to apply, in principle, an arbitrary number of voltages with an opposite sign to the erase voltage. In this case, the stability of these voltage levels depends substantially on the quality of the driver circuit.

In order to couple the driver circuit to the drive circuit, provision may be made that the drive circuit has a first voltage input, coupled to the switching device, to which the reference voltage is applied in the first and second operating states, wherein the voltage levels output by the driver circuit are applied in the third operating state.

In order to couple the erase-voltage generation circuit to the drive circuit, provision may be made that the drive circuit has a second voltage input, coupled to the erase-voltage generation circuit, to which the erase voltage is applied in the first and second operating states wherein the erase voltage, or a voltage which is less than or equal to the programming voltage in terms of magnitude, is applied in the third operating state.

For active switching of the reference voltage and for coupling the driver circuit to the drive line, provision may be made that the drive circuit has a first pump circuit, to be activated via a first internal clock input and connected between the first voltage input and the drive line, which blocks between the first voltage input and the drive line in the first operating state. The pump circuit operates as a pump circuit from the first voltage input to the drive line in the second operating state and operates as a pump circuit between the driver circuit, coupled to the first voltage input, and the drive line in the third operating state. The first pump circuit can, as desired, fulfil two different functions. On the one hand, provision may be made that the reference voltage is switched through actively using a pump mechanism in order to prevent collapse of the reference voltage because of leakage currents or interference which cause reduction of a charge once applied. Furthermore, provision may be made that the first pump circuit couples to the drive line the voltages supplied by the driver circuit with an opposite sign to the erase voltage.

For active switching of the erase voltage, provision may be made that the drive circuit has a second pump circuit, to be activated via a second internal clock input and connected between the second voltage input and the drive line, which operates as a pump circuit from the second voltage input to the drive line in the first operating state and which operates as a blocking circuit between the second voltage input and the drive line in the second and third operating states. In this case, the second pump circuit has the effect of switching the erase voltage through actively using a pump mechanism in order to prevent collapse of the erase voltage owing to leakage currents or interference which cause the reduction of a charge once applied. Furthermore, it has the effect of blocking the erase voltage in the case of active switch-th rough of the reference voltage or in the case of coupling of the voltages supplied by the driver circuit.

For reasons of operational reliability, provision may be made that the first pump circuit has a reset switch coupled to an externally drivable reset input, so that the first pump circuit operates reliably as a blocking circuit in the first operating state. Provision may be made, in the case of an address change emitted by an address decoder, to drive the reset input so that the first pump circuit, at first, reliably blocks.

A further measure which may be provided is that the second pump circuit has a deactivation switch which can be driven via the first internal clock input, so that the second pump circuit operates reliably as a blocking circuit in the second and third operating states. This also ensures that the erase voltage is blocked in the case of active switch-through of the reference voltage or in the case of coupling the voltages supplied by the driver circuit.

For the voltage-generating circuits, provision may be made that the semiconductor storage device for at least one associated group of storage cells of a word line, or bit line of the storage cells arranged on the semiconductor substrate at intersections of word lines and bit lines in matrix form, has both a single erase-voltage generation circuit and a single programming-voltage generation circuit which are assigned to the at least one drive circuit. This allows the use of globally generated voltages which can be both generated on the semiconductor substrate and supplied externally. In both cases, this leads to area being saved in comparison with the previously known circuits.

For activating the first and second pump circuits, provision may be made that a selection circuit is assigned to the drive circuit and, as a function of a selection signal applied to a selection input, assigns an external clock signal, applied to an external clock input, to a first or to a second internal clock output. In order to activate the pump circuits, a clock signal may be provided which is fed selectively either to the first pump circuit or to the second pump circuit.

In this case, for activating the first and second pump circuits, provision may be made that, for example, for a logical zero at the selection input, the selection circuit applies the external clock signal in phase opposition to the first internal clock output and sets the second internal clock output to logical one. For a logical one at the selection input, it applies the external clock signal in phase opposition to the second internal clock output and sets the second internal clock output to logical zero.

For the coupling of the selection circuit to the drive circuit, provision may be made that in the first and second operating states, the first internal clock output of the selection circuit is coupled to the first internal clock input and the second internal clock output of the selection circuit is coupled to the second internal clock input. Since one of the two pump circuits is active in each of the first and second operating states, clock signals may be provided in these operating states.

For coupling the driver circuit via the drive circuit to the storage cells, provision may be made that the switches of the first and second pump circuits, and the deactivation switch assigned to the second pump circuit each have MOSFET transistors with a common externally drivable substrate terminal. As a result, the semiconductor substrate may be at various potentials, which makes it possible to couple the voltages, supplied by the driver circuit, which have an opposite sign to the erase voltage.

In an embodiment of the pump circuit which is simple in terms of circuitry, provision may be made that a first capacitor is connected downstream of the first internal clock input and a second capacitor is connected downstream of the second internal clock input.

For the selection of various voltage levels to be supplied by the driver circuit, provision may be made that, in a first operating mode, the driver circuit outputs the voltage level for programing, or the one for maintaining the data content, as required as a function of a driver-selection signal applied to a driver-selection input and a second operating mode, outputs the voltage level for reading, This makes it possible, merely as a function of signals which need not have any particular electrical power, to apply voltages of different signs to a single drive line; it being possible for the voltages of both signs to exceed the supply voltage.

In a developed configuration, provision may be made that the reference voltage is applied to the common externally drivable substrate terminal in the first and second operating states, the programing voltage is applied in the third operating state and first operating mode, and the read voltage is applied in the third operating state and second operating mode.

In order to permit fast switching times, provision may be made that a clock signal with a pre-determined time length is applied in the third operating state to the first internal clock input directly after switching to the third operating state. In the third operating state, it is sufficient to apply the clock signal only in the starting phase and thereafter to keep it at the level which keeps the pump switch of the first pump circuit open.

In a furthermore preferred embodiment, provision may be made that the selection circuit has a second external clock input for applying a second external clock signal, separate from the external clock signal, and an amplitude-doubler circuit assigned to the second internal clock output and to the two clock inputs which, for a logical zero at the selection input, applies the external clock signal in phase opposition to the first internal clock output and sets the second internal clock output to logical one. For a logical one at the selection input, it applies the external clock signal in phase opposition, with an amplitude which is increased compared to the external clock signal, to the second internal clock output and sets the first internal clock output to logical zero, In a further embodiment, in particular of the second pump circuit, provision may be made to apply clock signal in order, which exceed the supply voltage, to drive the switches of the pump circuit.

Taking into account the technology which is employed the physical structure of the storage cells, provision may be made that the reference voltage represents a zero voltage, the supply voltage has a value of about +5 volts, the erase voltage has a value of about −12 volts, and the programming voltage has a value of about +18 volts.

Additional features and advantages of the present invention are described in, and will be apparent from, the Detail Description of the Preferred Embodiments and the Drawings.

DESCRIPTION OF THE DRAWINGS

FIGS. 1A and 1B show the schematic structure of a typical storage cell of a non-volatile electrically erasable programmable semiconductor memory which is known.

FIG. 2 shows an arrangement of known storage cells and their coupling to bit and word lines.

DETAILED DESCRIPTION OF THE INVENTION

Figure 3:
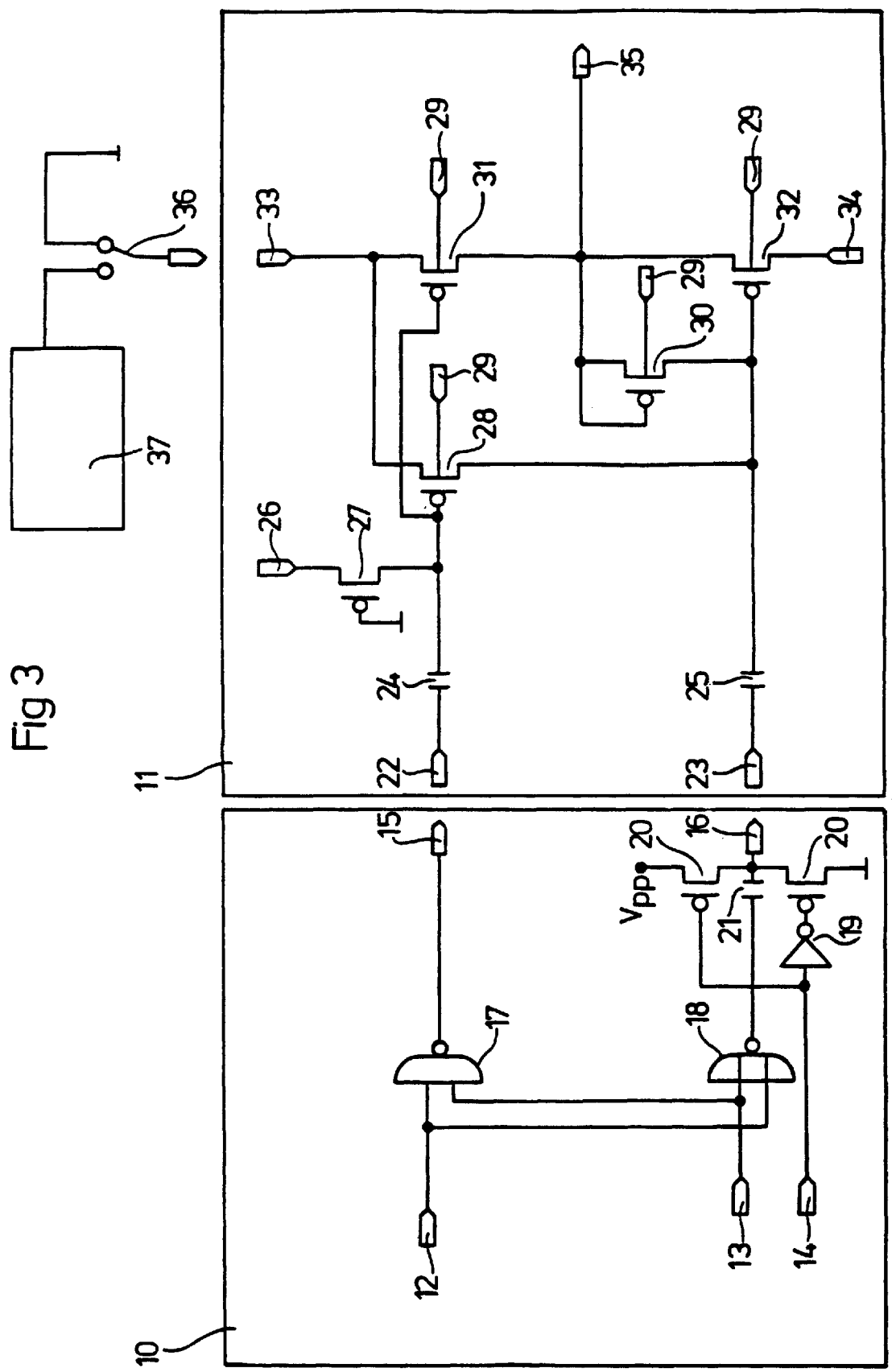
FIG. 3 shows a schematic circuit diagram of a first illustrative embodiment of a drive circuit along with a selection circuit with amplitude doubler.

With the aid of FIGS. 1A and 1B, an explanation will firstly be given of the structure and the mode of operation of a known electrically programmable and erasable semiconductor memory with a large number of storage cells SZ. Each storage cell BZ consists of a control electrode 1, a floating electrode 2, a source region 3, a drain region 4, a substrate region 5 and insulators 6 and 7. The insulator 6 is arranged between the control electrode 1 and the floating electrode 2, and the insulator 7 is arranged between the floating electrode 2 on one side, and the source region 3, the drain region 4 and the substrate region 5 on the other side. The floating electrode 2 is located, surrounded by the insulators 6 and 7, between the control electrode 1, the source region 3 and the drain region 4. The storage of information items corresponds to the supply and removal, or charges to and from, the floating electrode 2. This is done by applying suitable voltages between the control electrode 1 and the drain region 4. For reading, a positive voltage is applied to the control electrode 1, this voltage being typically about +2.5 volts and therefore of the order of the supply voltage and not being sufficient for electrons or holes to be able to overcome the insulation to enter the drain region 4. For programing, a positive high voltage, which is typically about +18 volts and therefore exceeds the supply voltage, is applied to the control electrode 1 in order to inject electrons into the floating electrode 2. For erasing, a negative high voltage, which is typically about −12 volts and therefore exceeds the supply voltage in terms of magnitude, is applied to the control electrode 1 in order to inject holes into the floating electrode 2. During programing and erasing, it is possible, because of the high field strength, for electrons or holes to tunnel through the potential barrier of the insulator 7 (Fowler-Nordheim effect), or for hot electrons originating in the vicinity of the drain region 4 to overcome the insulator 7 ("channel hot electron effect").

In a typical storage arrangement according to FIG. 2, when the stored data contents are read out from the storage cells SZ, a bit line 8 is either switched through to the source terminal of the cells or remains isolated. Assigned to the bit lines 8, there are sense amplifiers (not represented in further detail) which detect the cell state on the evidence of the current flowing through the storage cell SZ or on the evidence of a potential shift on the respective bit line B. The reference numbers 9 denote word lines which, for addressing the storage cells SZ, are connected to an address-decoder circuit (not represented in further detail). Details of the arrangement and mode of operation of a memory of this type are familiar to the person skilled in the art and shall not therefore be described in further detail here.

FIG. 3 shows a first illustrative embodiment of the circuit arrangement according to the present invention with a selection circuit 10 and a drive circuit 11. The selection circuit 10 has a selection input 12, a first external clock input 13, a second external clock input 14, a first internal clock output 15 and a second internal clock output 16. Furthermore, the selection circuit 10 consists of a negated MID gate 17 and a negated OR gate 18. The respective first inputs of the two gates 17 and 16 are coupled to the selection input 17, and the respective second inputs of the two gates 17 and 18 are coupled to the first external clock input 13. The output of the negated MID gate 17 corresponds to the first internal clock output 15 of the selection circuit 10. The output of the negated OR gate 18 is connected via the capacitor 21 to the second internal clock output 16 of the selection circuit 10. Likewise at the second internal clock output 16 there is the coupling point of two transistors 20 connected in series. The supply voltage $V_{pp}$ applied to the series circuit consisting of the two transistors 20. The control input of one of the transistors 20 is connected directly to the clock input 14, while the control input of the other of the two transistors 20 is connected via a NOT gate 19 to the second external clock input 14. Mutually inverted digital signals are therefore always applied to the control inputs of the two transistors 20. The components 19 to 21 form an amplitude-doubler circuit. The drive circuit 11 has five inputs 22, 23, 26. 33, 34 and a single output 35. The inputs 22 and 23 represent internal clock inputs of the drive circuit I1, which are coupled to the internal clock outputs 15. 16 of the selection circuit 10. The input 26 is an externally drivable reset input. As a function of a switching device 36, the first voltage input 33 is either, in the first and second operating states, coupled to earth, which in all illustrative embodiments represents the potential of the reference voltage, or, in the third operating state, is coupled to a driver circuit 37 supplying positive voltages. The second voltage input 34 is coupled to an erase-voltage generation circuit which generates the negative high voltage. The control electrodes 1 of the storage cells SZ are driven via the drive line 35 and the corresponding word line 9 (see FIG. 2). The first internal clock input 22 is connected via the capacitor 24 to the control input of a transistor 31 which operates as a pump switch. The transistor 27, which operates as a reset switch and whose control input is earthed, is interconnected between the control input of the transistor 31 and the reset input 26. The second internal clock input 23 is connected via the capacitor 25 to the control input of a transistor 32 which operates as a pump switch. A transistor 28, which operates as a deactivation switch and has the control input in common with the transistor 31, is connected between the first voltage input 33 and the control input of the transistor 31. A transistor 30, which operates as a feedback switch and whose control input is likewise coupled to the drive line 35, is connected between the drive line 35 and the control input of the transistor 32. The transistors 28, 30, 31 and 32 have a common externally drivable substrate terminal 29. In all illustrative embodiments, provision is made that the positive voltage supplied by the driver circuit 37 is applied to the first voltage input 33 in the third operating state, and the zero volt level is applied in the first and second operating states. Likewise, in all illustrative embodiments, provision is made that the negative high voltage supplied by the erase-voltage generation circuit is applied to the input 34 in the first and second operating states, and either the negative high voltage supplied by the erase-voltage generation circuit, or a voltage which is less than or equal to the programming voltage in terms of magnitude, is applied in the third operating state. These voltages are supplied by voltage-generation circuits which are either external or are located on the semiconductor substrate 5 and are not represented in further detail in the figures. In this case, in principle, only two voltage-generating circuit, are required; one for the positive voltage for reading and the positive high voltage for programing, and another for the negative high voltage for erasing.

The made of operation will be explained below with the aid of the first illustrative embodiment represented in FIG. 3. The drive circuit 11 operates in the three operating states which have been mentioned. In the first and second operating states, the first voltage input 33 is connected to earth by the switching device 36. If a signal corresponding to the first operating state is applied to the selection Input 12, then the negative high voltage, of about −12 volts, which is applied to the second voltage input 34 is applied via the drive line 35 and the word line 9, assigned to the 20 corresponding storage calls SZ, to the control electrodes 1 in order to inject holes into the floating electrodes 2 of the storage cells SZ for erasing. If a signal corresponding to the second operating state is applied to the selection input 12, then the earth potential, applied to the first voltage input 33, is switched through via the drive line 35 and the word line 9, assigned to the corresponding storage cells SZ, to the control electrodes 1 of the corresponding storage cells SZ. In the third operating state, the positive voltages, applied to the first voltage input 33 and supplied by the driver circuit 37 via the switching device 36, are switched through to the drive line 35. In the first operating state, the zero voltage is applied to the selection input 12 wherein the clock signal applied to the first external clock input 13 is switched through with doubled amplitude $U_{23,max}$ to the second internal clock output 16 and therefore to the second internal clock input 23, The amplitude-doubler circuit, constructed from the NOT gate 19, the two transistors 20 and the capacitor 21, is required for reliable driving of the transistor 32. At the second internal clock input 23, therefore, it is necessary to have a clock signal $U_{23}$ with an amplitude $U_{23,max}$ which exceeds the threshold voltage $U_{32,min}$ of the transistor 32 by a factor of two. For supplying the amplitude-doubler circuit 19, 20, 21, two separate clock signals, with an upper voltage level of 5 volts and a lower voltage level of 0 volts, are applied to the two external clock inputs 13, 14. By virtue of the clock signal $U_{23}$ applied to the second internal clock input 23, the second pump circuit, consisting of the capacitor 25 and the transistor 32, is activated and packetswitches the negative high voltage applied to the second voltage input 34. The voltage $U_{32}$ applied to the control input of the transistor 32 is initially composed of the voltage $U_{35}$, applied to the drive line 35 and the magnitude of the threshold voltage $U_{32,min}$ of the transistor 32

$$U_{32}=U_{35}+|U_{32,min}|$$

and is reduced, when using the clock signal $U_{23}$ with the amplitude $U_{23,max}$ at the second internal clock input 23, by the difference $$Ud \leq U_{23,max}-2+|U_{32,min}|$$

between the clock signal amplitude $U_{23,max}$ applied to the second internal clock input 23 and twice the magnitude of the threshold voltage $U_{32,min}$ of the transistor 32:

$$U_{35} \rightarrow U_{35}-dU.$$

However, the above equations are valid only if the capacitance $C_{25}$ of the capacitor 25 is large compared to the stray capacitances and capacitances $C_{30}$, $C_{32}$ of the transistors 30 and 32. The first internal clock output 15, and therefore also the first internal clock input 22, are deactivated with the effect that the pump switch 31 of the first pump circuit blocks between the first voltage input 33 and the drive line 35. Except during an address change, the reset input 26 is continuously earthed. During an address change, the supply voltage is briefly applied to the reset input 26 in order to set the control inputs of the transistors 28 and 31 to a nonnegative potential. Otherwise, through bridging, the control inputs of the transistors 28 and 31 could acquire a negative potential. As a result, the transistors 28 and 31 could become permanently open. In the second operating state, a five volt level is applied to the selection input 12. As a result, the clock signal applied to the first external clock input 13 is switched through, inverted, to the first internal dock output 15 and thereby to the first internal clock input 22. The first pump circuit, consisting of the capacitor 24 and the transistor 31, is activated by the clock signal and switches through actively the zero voltage applied to the first voltage input 33, Conversely, the second internal clock output 16, and therefore also the second internal clock input 23, are deactivated. As a result, the pump switch 32 of the second pump circuit blocks between the second voltage input 34 and the drive line 35. In the third operating state, a five volt level is likewise applied to the selection input 12. As a result, the clock signal applied to the first external clock input 13 is switched through to the first internal clock input 22. The first pump circuit, consisting of the capacitor 24 and the transistor 31, is activated by the clock signal and actively switches through the positive voltage which is applied to the first voltage input 33 and is supplied by the driver circuit 37 via the switching device 36. As a function of the signals applied to the two driver-selection inputs 43, 44, the programing voltage, the read voltage or the zero voltage is applied to the first voltage input 33 by the driver circuit 37. Likewise, in the third operating state, the same voltages are applied to the externally driyable substrate terminals 29 by the driver circuit 37 as to the first voltage input 33. In order to permit fast switching times, it may be sensible to switch on the clock only in the starting phase and thereafter keep it at the lower level. As a result, the control input of the transistor 31 remains at a negative potential and the transistor 31 remains open. The second internal clock output 16, and therefore also the second internal clock input 23, are deactivated, as a result of which the pump switch 32 of the second pump circuit blocks between the second voltage input 34 and the drive line 35.

Figure 4:
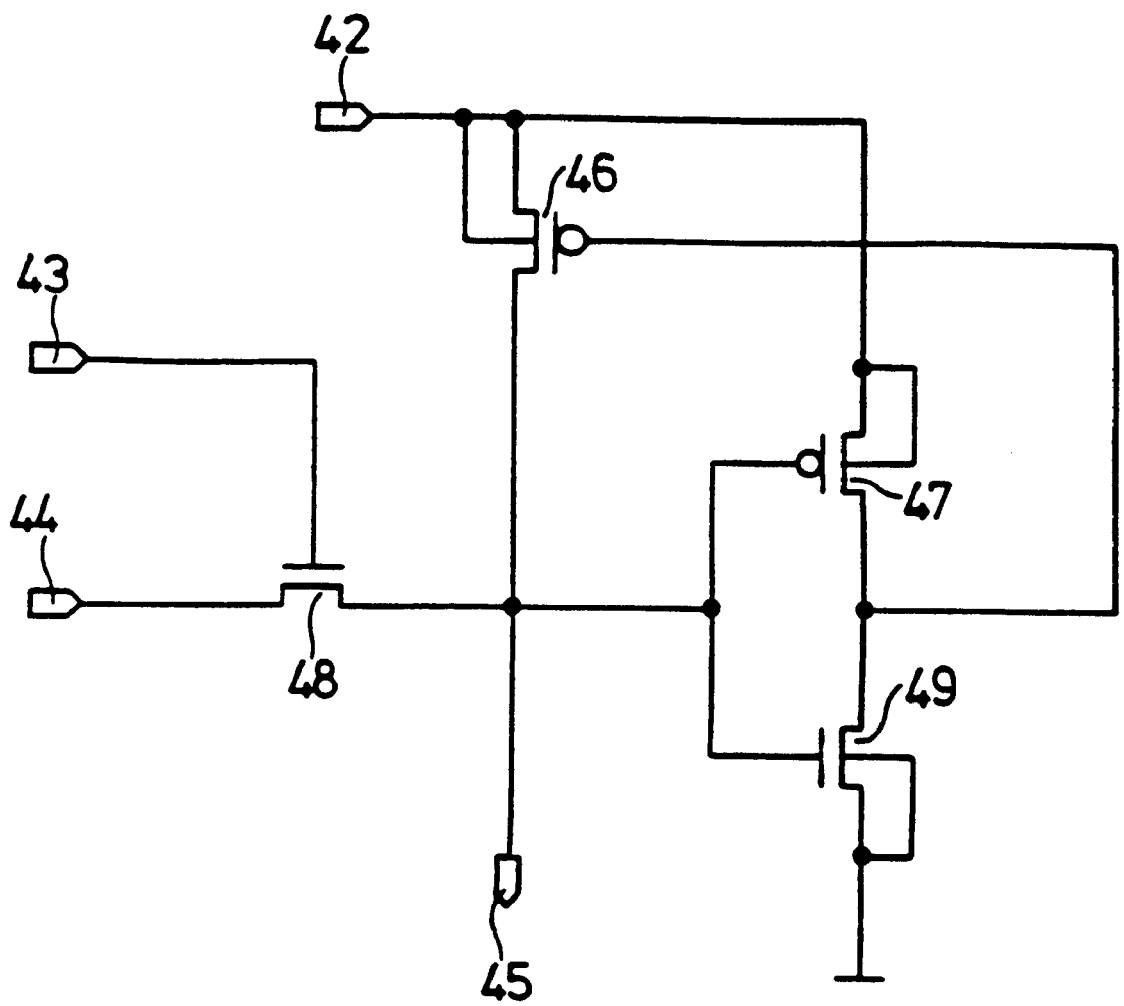
FIG. 4 shows a schematic circuit diagram of a driver circuit for positive voltages.

FIG. 4 shows further details of the driver circuit 37 which is connected downstream of a programming-voltage generation circuit, is coupled via the switching device 36 to the drive circuit 11, 39, 40, and supplies the positive voltages to the drive circuit 11, 39, 40. The circuit 37 has three Inputs 42, 43, 44 and one output 45. The output 45 is intended for coupling via the switching device 36 to the first voltage input 33 of the drive circuit 11. The driver circuit 37 consists of four transistors, two p-channel FET transistors 46,47, and two n-channel FET transistors 49, 49. The input 42 is a voltage input for coupling a programming-voltage generation circuit or for applying a positive high voltage, which is typically about +18 volts. The inputs 43 and 44 are driver-selection inputs. As a function of the signals applied to the driver-selection inputs 43, 44, the driver circuit switches through, onto the output 45 and therefore onto the first voltage input 33 of the drive circuit 11, 39, 40, either the positive high voltage for programming, applied to the input 42, a reduced high voltage for reading, typically about +2.5 volts, or a zero volt level for maintaining the data content.

FIGS. 5 through 8 represent the temporal profile of the voltages applied to various selected points of the circuit represented in FIG. 3.

Figure 5:
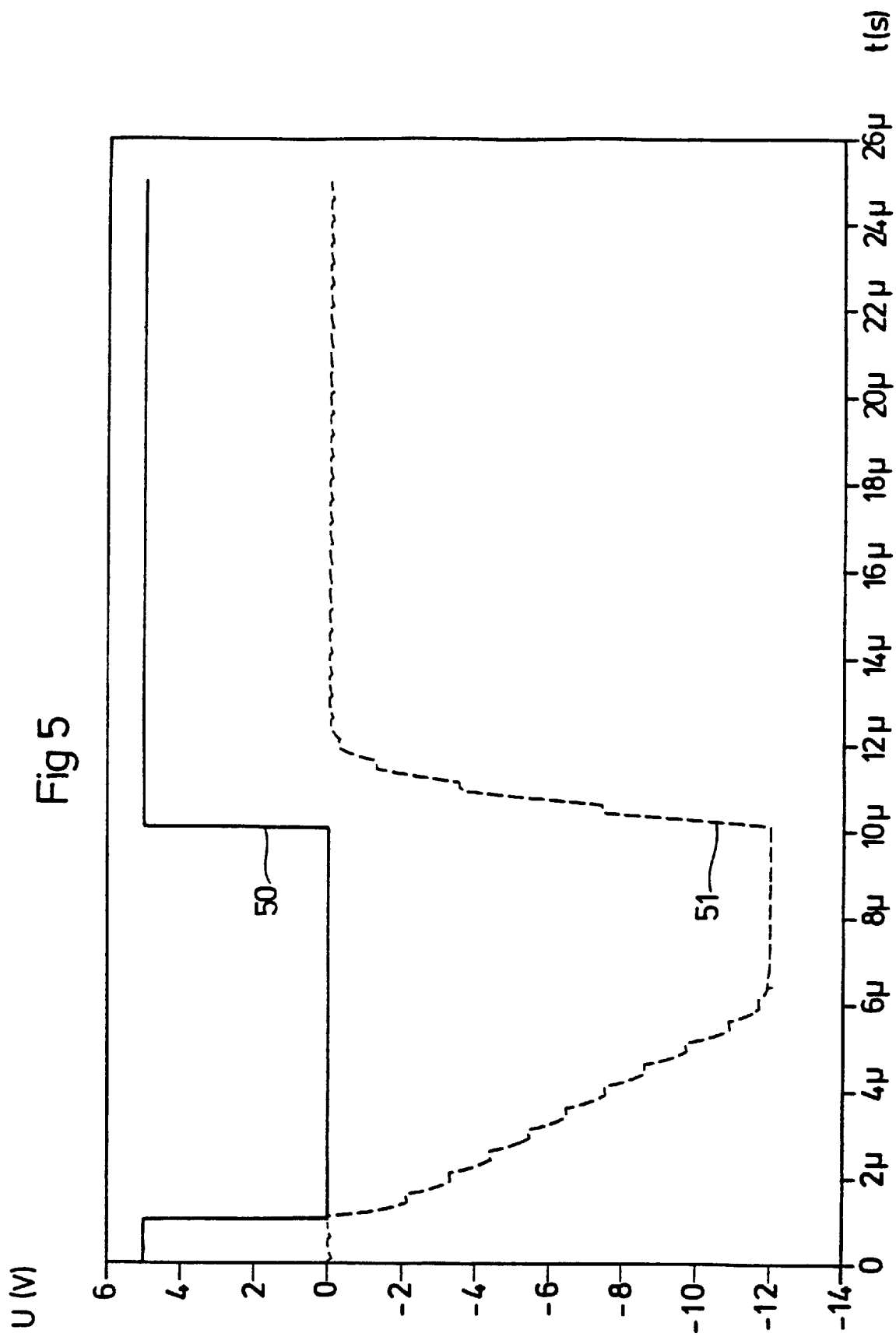
FIG. 5 shows a schematic representation of a simulation result with, as a function of time, the voltages applied to the selection input and to the drive line after application of an erase voltage, and the reference voltage applied to a word line.

FIG. 5 shows the temporal voltage profile of the signal 50 applied to the selection input 12 and of the signal 51 applied to the drive line 35. Driving the selection input 12 switches between the first and second operating states. The zero volt level at the selection input 12 corresponds to the first operating state, and the five volt level corresponds to the second operating state. If the five volt level is applied to the selection input 12, the zero volt level applied to the first voltage input 33, which is coupled to earth via the switching device 36, is switched through to the drive line 35, In the case of a zero volt level at the selection input 12, the erase voltage which is applied to the second voltage input 34, and is here equal to about −12 volts, is switched through onto the drive line. The pump process lasts about 5 µs before the predetermined voltage is achieved. In contrast, after a switch-over at the selection input, it lasts only about 2 µs before the reference voltage is applied to the drive line.

Figure 6:
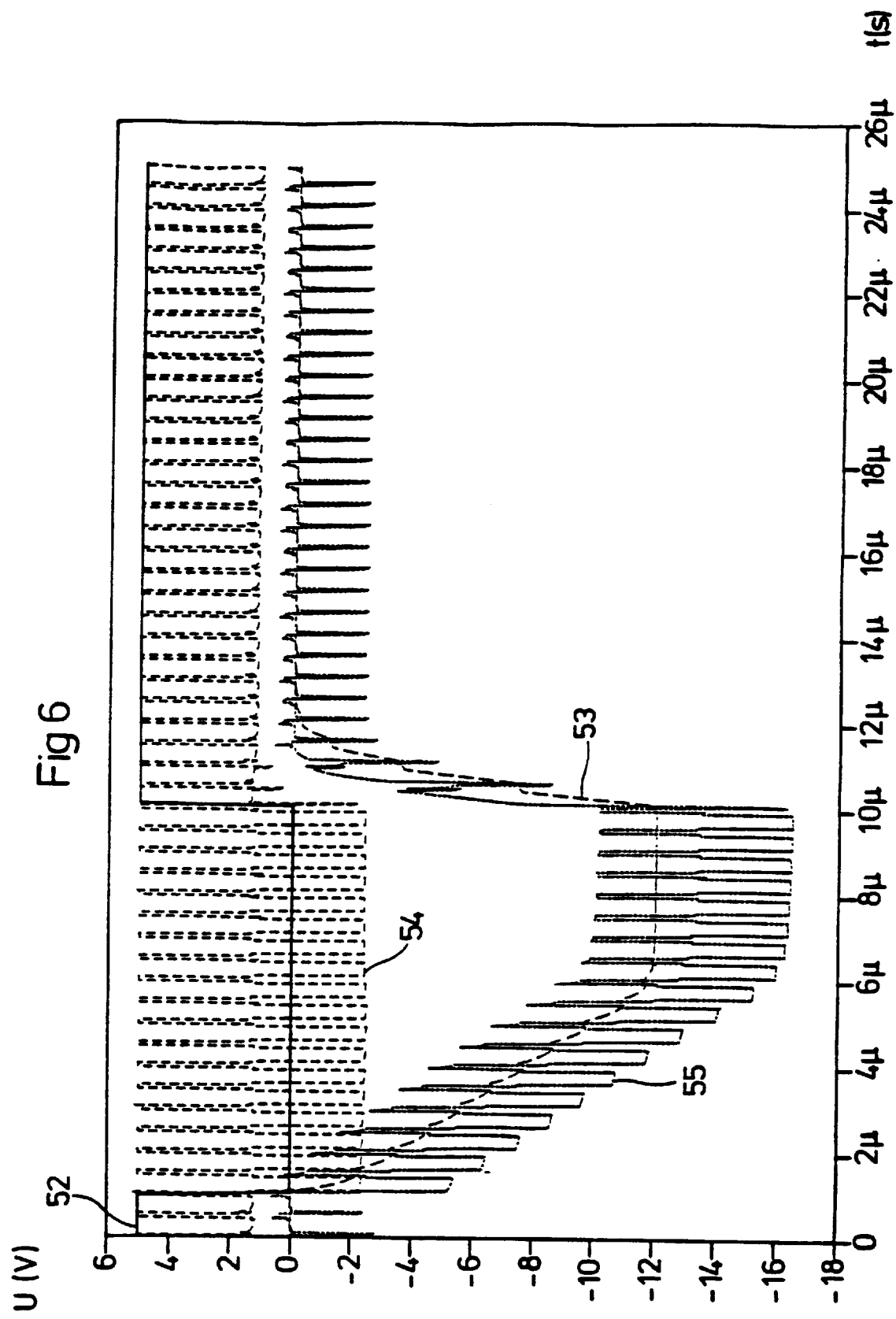
FIG. 6 shows a schematic representation of a simulation result with, as a function of time, the voltages applied to the selection input, to the drive line, to the second internal clock input and to the control input of the pump switching transistor of the second pump circuit, after application of an erase voltage and the reference voltage to a word line.

The voltage profiles 52, 53, 54, 55 represented in FIG. 6 reproduce the same process as in FIG. 5. The diagrams 52 and 53 represented in FIG. 6 correspond to the diagrams 50 or 51 from FIG. 5. In addition, FIG. 6 represents the profile of the voltage 54 at the second internal clock input 23 and the profile of the voltage 55 at the control input of the second pump switch 32. At both points, the voltage oscillates at the frequency of the clock signal. In the case of the first operating state, the amplitude of both signals 54, 55 is about 7 volts, whereas in the second operating state, the amplitude of both signals is about 4 volts. The signal 55, applied to the control input of the second pump switch 32, corresponds to the signal 53 which is applied to the drive line 35 and is amplitude-modulated with the signal 54 at the second clock input 23.

Figure 7:
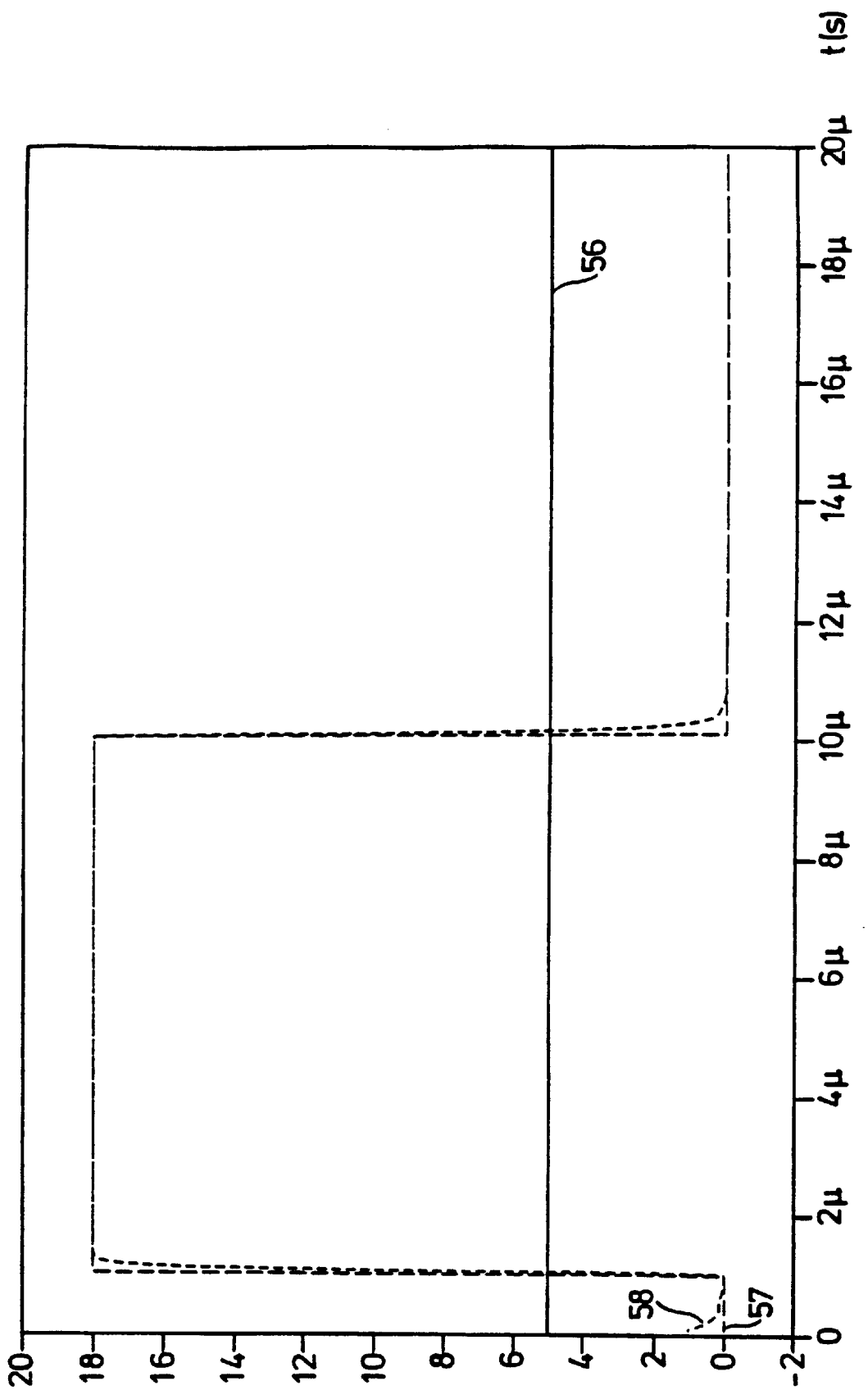
FIG. 7 shows a schematic representation of a simulation result with, as a function of time, the voltages applied to the selection input, to the output of the driver circuit, and to the drive line, after application of a programing voltage and the reference voltage to a word line.

FIG. 7 represents diagrams 56, 57, 58 which represent the voltage profile 56 at the selection input 12, the voltage profile 57 at the first voltage input 33 and the voltage profile SB at the drive line 38 in the third type of operation. The selection input 12 is permanently at 5 volt since the signals 56 applied thereto are relevant only for the first two types of operation. Comparing the voltage profile 57 at the first voltage input 33 with the voltage profile 58 at the drive line 35 shows that the drive circuit 11 switches through, virtually without delay, the positive high voltage supplied by the driver circuit 37. The delay time is less than about 1 µs.

Figure 8:
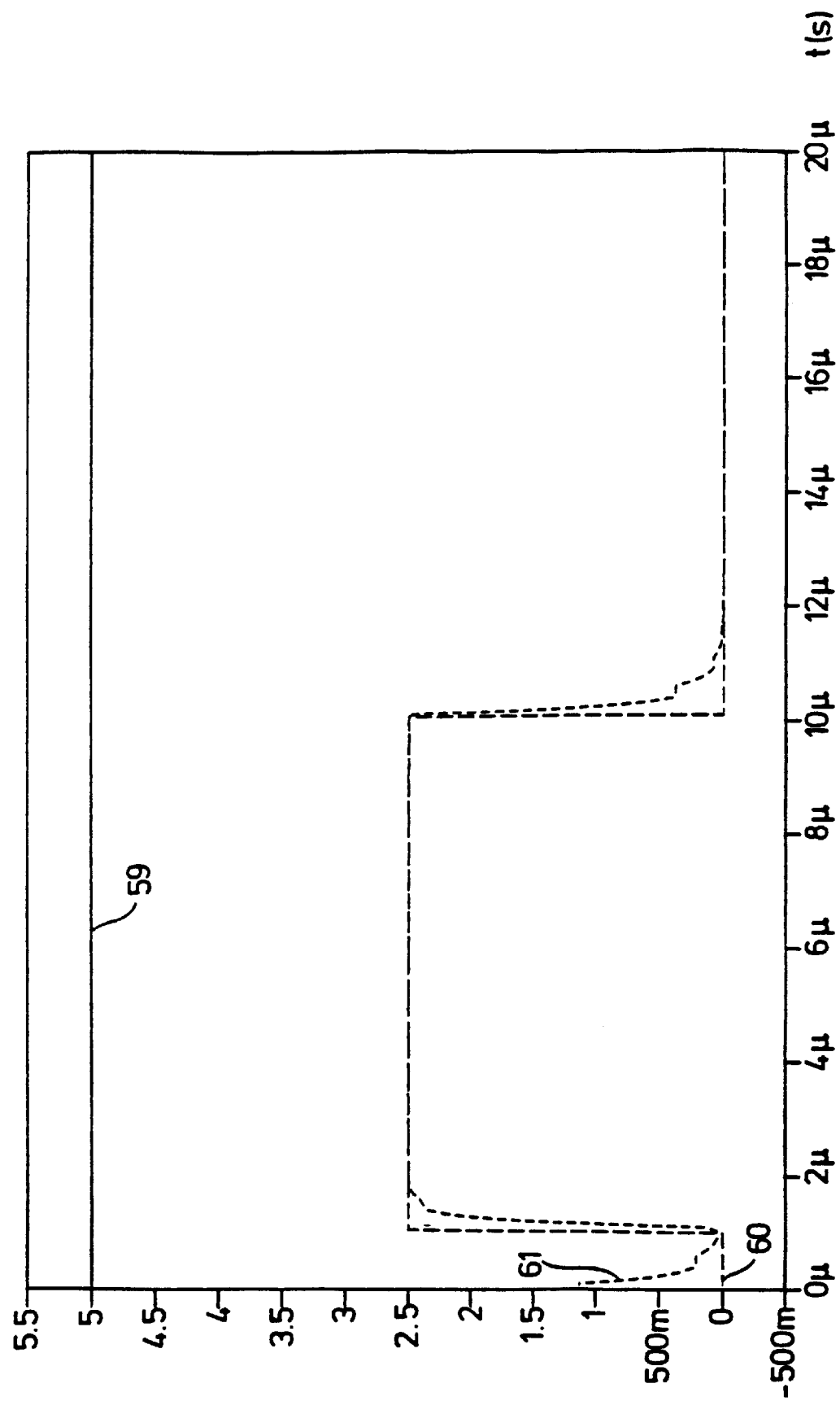
FIG. 8 shows a schematic representation of a simulation result with, as a function of time, the voltages applied to the selection input, to the output of the driver circuit and to the drive line during application of a read voltage and the reference voltage to a word line.

In similar fashion to FIG. 7, FIG. 8 represents the switch-through of a positive voltage supplied by the driver circuit 37 with representation of the voltage profile 59 at the selection input 12, the voltage profile 60 at the first voltage input 33 and the voltage profile 61 at the drive line 38 in the third operating state. Instead of the programming voltage, which is about +18 volts, the read voltage of about +2.5 volts is applied. In this case as well, the delay times are about of the same order as when applying the programming voltage, and are less than about 1 µs.

Figure 9:
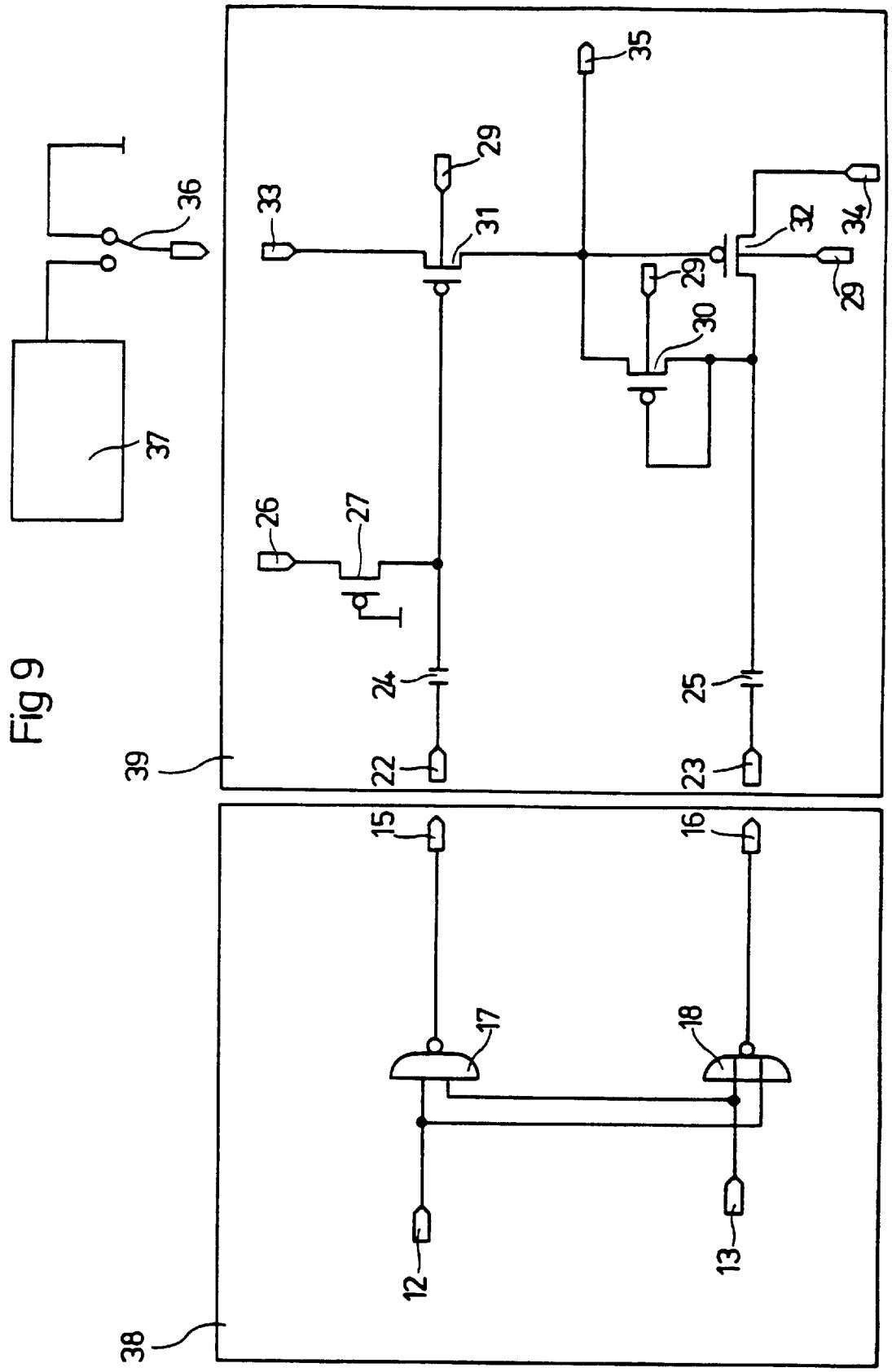
FIG. 9 shows a schematic circuit diagram of a second illustrative embodiment of a drive circuit along with a selection circuit without amplitude doubler.

The second illustrative embodiment of the drive circuit 39 according to the present invention, which is represented in FIG. 9, has a similar structure to the drive circuit 11 of the first illustrative embodiment, In this case, the selection circuit 38 represents a version of the selection circuit 10, reduced by the amplitude-doubler circuit 19, 20, 21 and the second external clock input 14. The selection circuit 38 consists of the selection input 12, the first external clock input 13, the negated AND gate 17, the negated OR gate 16 and the internal clock outputs 15 and 16. The drive circuit 39 of the second illustrative embodiment likewise represents a reduced version of the corresponding circuit 11 according to the first illustrative embodiment. The transistor 26, which operates as a deactivation switch, is omitted and, as regards the transistor 32, the control input is swapped with the electrode coupled to the drive line 35, in comparison with the drive circuit 11. The transistors 30, 31 and 32 have a common externally drivable substrate terminal 29.

The amplitude-doubler circuit 19, 20, 21 is not required for the drive circuit 39 since an arbitrarily small voltage level $U_{23,max}$ at the second internal clock input 23 is sufficient for driving the transistor 32. During each period of the clock signal $U_{23,max}$ applied to the second internal clock input 23, the charge stored in the capacitor 25 is distributed uniformly between the capacitor 25 and the driven storage cells SZ, acting as a capacitive load $C_{SZ}$, wherein the charge stored in the capacitor 25 is proportional to the product of the amplitude $U_{23,max}$ of the clock signal applied to the second internal clock input 23 and the capacitance $C_{25}$ of the capacitor 25.

$$U_{32}=U_{35} \rightarrow U_{32}=U_{35}-(C_{25}+U_{23,max})/C_{25}+C_{SZ})$$

For the drive circuit 39, on the one hand clock signals with small amplitude 23 and are sufficient at the second internal clock input 23 and, on the other hand, in the case of an unfavourable capacitance ratio for which the capacitance $C_{25}$ of the capacitor 25 is small compared to the capacitance $C_{SZ}$ of the driven storage cells SZ, only a small current flows via the drive line 35, which entails a comparatively long-lasting pump process. This disadvantage can be eliminated only by a capacitor 25 with high capacitance $C_{25}$ and a concomitant large area requirement on the semiconductor substrate 5.

Figure 10:
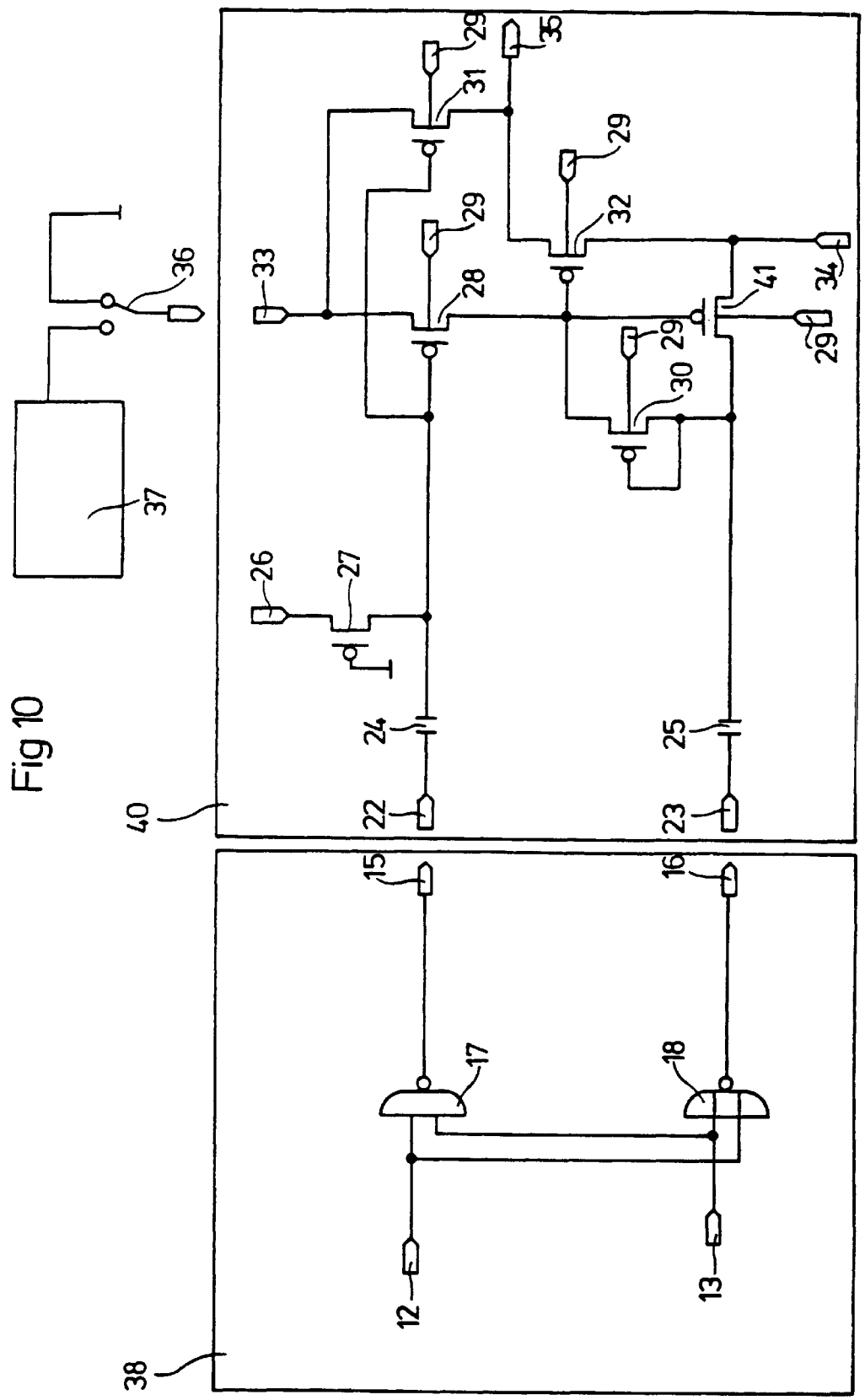
FIG. 10 shows a schematic circuit diagram of a third illustrative embodiment of a drive circuit along with a selection circuit without amplitude doubler.

The third illustrative embodiment, represented in FIG. 10, consists of the drive circuit 40 and of the same selection circuit 38 as from the second illustrative embodiment. The drive circuit 40 is an embodiment with elements of the drive circuits 11 and 39 from the first two illustrative embodiments. In comparison with the drive circuit 39 of the second illustrative embodiment, the drive circuit 40 of the third illustrative embodiment has a further transistor 32 which is connected in series with the transistor 41 and has a common control input with the latter. The coupling point of the two transistors 32 and 41, which are connected one after the other, is connected to the second voltage input 34. The transistor 41 electrode, remote from the transistor 32, is coupled to the capacitor 25. Unlike in the drive circuit 39 from the second illustrative embodiment, the transistor 30, operating as a feedback component, is connected between the common control terminal of the transistors 32 and 41 and the coupling point of the transistor 41 to the capacitor 25. The transistors 28, 30, 31, 32 and 41 have a common externally drivable substrate terminal 29.

In comparison with the drive circuits 11, 39, the drive circuit 40 operates in the first operating state as follows. As in the case of the drive circuit 39, the amplitude-doubler circuit 19, 20, 21 is not required for the drive circuit 40 in order to activate the second pump circuit 25, 32, 41. By virtue of the two transistors 32 and 41, the output load behavior is improved, in particular in comparison with the drive circuit 39. During each period of the clock signal $U_{23}$, applied to the second internal clock input 23, the charge stored in the capacitor 25 is distributed uniformly between the capacitor 25 and the control inputs of the transistors 32 and 41, acting as capacitive load $C_{32,41}$, the effect of which is to cause the following change for the voltage 035 applied to the drive line 35:

$$U_{35} \rightarrow US_{35} - (C_{25} + U_{23,max})/C_{25} + C_{32,41}) = U_{35} - U_{23,max}$$

Because of the comparatively small capacitance of the coupled control inputs of the transistors 32 and 41, the capacitor 25 does not require too great a capacitance $C_{25}$ and therefore not a very great area on the semiconductor substrate 5. A fast pump process can be achieved with a small capacitor 25. In the second and third operating states, the drive circuit 40 operates like the drive circuits 13 and 39. Overall, the drive circuit 40 represents a synthesis of the drive circuits 13 and 39.

Although the present invention has been described with reference to specific embodiments, those of skill in the art will recognize that changes may be made thereto without departing from the spirit and scope of the invention as set forth in the hereafter appended claims.

What is claimed is:

1. A semiconductor storage device capable of being operated in at least three operating states for the programmable storage of data contents, a first operating state assigned to erasing data contents, a second operating state assigned to maintaining data contents, and a third operating state assigned to programming, reading, and maintaining data contents, the device comprising:

a semiconductor substrate;

a plurality of storage cells arranged on the substrate;

a selection circuit for selecting an associated group of storage cells from the plurality of storage cells;

one drive circuit with a drive line coupled to all storage cells of the associated group of storage cells, the drive circuit assigned in common to the associated group of storage cells for selective application of an erase voltage and a reference voltage along the drive line to the associated group of storage cells for erasing and maintaining, respectively, data contents of the associated group of storage cells, the drive circuit including one pump circuit acting as a function of a selection signal in actively switching the erase voltage and the reference voltage as desired onto the drive line; and a programming-voltage generation circuit coupled to the drive circuit via a switching device, the generation circuit supplying the drive circuit with a programming voltage for programming a storage cell wherein the programming voltage has an opposite sign to the erase voltage and exceeds the voltage of a supply voltage, the switching device being controlled by a state selection line wherein the switching device selectively outputs to the drive circuit a programming voltage, a read voltage and the reference voltage.

2. A semiconductor storage device as claimed in claim 1, further comprising:

a selection-signal circuit connected upstream of the drive circuit, the selection-signal circuit producing a selection signal for controlling the drive circuit in selecting the erase voltage and the reference voltage.

3. A semiconductor storage device as claimed in claim 1, further comprising:

a plurality of word lines and a plurality of bit lines arranged on the substrate in matrix form, wherein the plurality of storage cells are arranged at intersections of the plurality of word lines and the plurality of bit lines, and the associated group of storage cells corresponds to one of the plurality of word lines.

4. A semiconductor storage device as claimed in claim 1, further comprising:

a driver circuit connected downstream of the generation circuit and upstream of the switching device, the driver circuit outputting to the switching device voltage levels assigned to the third operating state for programming, reading and maintaining the data contents of the associated group of storage cells.

5. A semiconductor storage device as claimed in claim 4, wherein the drive circuit includes a first voltage input coupled to the switching device such that the reference voltage is applied to the first voltage input in the first and second operating states, and the voltage levels output by the driver circuit are applied to the first voltage input in the third operating state.

6. A semiconductor storage device as claimed in claim 4, wherein the drive circuit includes a second voltage input coupled to an erase-voltage generation circuit such that the erase voltage is applied to the second voltage input in the first and second operating states, and a voltage which is less than or equal to the programming voltage is applied to the second voltage input in the third operating state.

7. A semiconductor storage device as claimed in claim 5, wherein the drive circuit includes a first pump circuit connected between the first voltage input and the drive lines and activated via a first internal clock input, wherein the first pump circuit blocks between the first voltage input and the drive line in the first operating state, operates as a pump circuit from the first voltage input to the drive line in the second operating state, and operates as a pump circuit between the driver circuit and the drive line in the third operating state.

8. A semiconductor storage device as claimed in claim 6, wherein the drive circuit includes a second pump circuit connected between the second voltage input and the drive line and activated via a second internal clock input, wherein the second pump circuit operates as a pump circuit from the second voltage input to the drive line in the first operating state, and operates as a blocking circuit between the second voltage input and the drive line in the second and third operating states.

9. A semiconductor storage device as claimed in claim 7, wherein the first pump circuit has a reset switch coupled to an externally drivable reset input.

10. A semiconductor storage device as claimed in claim 8, wherein the second pump circuit has a deactivation switch which can be driven via the first internal clock input.

11. A semiconductor storage device as claimed in claim 3, further comprising:
    a single erase-voltage generation circuit and a single programming-voltage generation circuit which are both assigned to the at least one drive circuit.

12. A semiconductor storage device as claimed in claim 2, wherein, as a function of the selection signal applied to a selection input, the selection circuit assigns an external clock signal, applied to an external clock input, to a first or to a second internal clock output.

13. A semiconductor storage device as claimed in claim 12, wherein, for a logical zero at the selection input, the selection circuit applies the external clock signal in phase opposition to the first internal clock output and sets the second internal clock output to logical one, and wherein, for a logical one at the selection input, the selection circuit applies the external clock signal in phase opposition to the second internal clock output and sets the first internal clock output to logical zero.

14. A semiconductor storage device as claimed in claim 12, wherein, in the first and second operating states, the first internal clock output of the selection circuit is coupled to a first internal clock input which activates a first pump circuit of the drive circuit, and the second internal clock output of the selection circuit is coupled to a second internal clock input which activates a second pump circuit of the drive circuit.

15. A semiconductor storage device as claimed in claim 14, wherein switches of the first and second pump circuits and a deactivation switch of the second pump circuit have MOSFET transistors with a common externally drivable substrate terminal.

16. A semiconductor storage device as claimed in claim 14, wherein a first capacitor is connected downstream of the first internal clock input and a second capacitor is connected downstream of the second internal clock input.

17. A semiconductor storage device as claimed in claim 4, wherein, as a function of driver-selection signals applied to driver-selection inputs, the driver circuit outputs the voltage for programming, reading and maintaining the data contents, as desired.

18. A semiconductor storage device as claimed in claim 15, wherein the reference voltage is applied to the common externally drivable substrate terminal in the first and second operating states, the programming voltage is applied in the third operating state and first operating mode, and the read voltage is applied in the third operating state and second operating mode.

19. A semiconductor storage device as claimed in claim 7, wherein a clock signal with a predetermined time length is applied in the third operating state to the first internal clock input, directly after switching to the third operating state.

20. A semiconductor storage device as claimed in claim 12, wherein the selection circuit has a second external clock input which applies in phase opposition to the first internal clock output both a second external clock signal and an amplitude-doubler circuit, which is assigned to both the second internal clock output and the first and second external clock inputs, for a logical zero at the selection input, and wherein the selection circuit applies, for a logical one at the selection input, the second external clock signal in phase opposition, with an amplitude which is increased compared to the external clock signal, to the second internal clock output and sets the first internal clock output to logical zero.

21. A semiconductor storage device as claimed in claim 1, wherein the reference voltage represents a zero voltage, the supply voltage has a value of about +5 volts, the erase voltage has a value of about −12 volts, and the programming voltage has a value of about +18 volts.

* * * * *